(12) United States Patent
Cheng et al.

(10) Patent No.: US 9,905,600 B1
(45) Date of Patent: Feb. 27, 2018

(54) IMAGE SENSOR DEVICE AND MANUFACTURING METHOD THEREOF

(71) Applicant: TAIWAN SEMICONDUCTOR MANUFACTURING COMPANY LTD., Hsinchu (TW)

(72) Inventors: Yu-Hung Cheng, Tainan (TW); Yeur-Luen Tu, Taichung (TW); Tung-I Lin, Tainan (TW); Cheng-Lung Wu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/339,352

(22) Filed: Oct. 31, 2016

(51) Int. Cl.
| | | |
|---|---|---|
| *H01L 27/00* | (2006.01) | |
| *H01L 31/00* | (2006.01) | |
| *H01L 27/146* | (2006.01) | |
| *H01L 31/0352* | (2006.01) | |

(52) U.S. Cl.
CPC .... *H01L 27/1463* (2013.01); *H01L 27/14621* (2013.01); *H01L 27/14627* (2013.01); *H01L 27/14636* (2013.01); *H01L 27/14685* (2013.01); *H01L 27/14687* (2013.01); *H01L 31/035236* (2013.01)

(58) Field of Classification Search
CPC .......... H01L 27/1463; H01L 27/14621; H01L 27/14627; H01L 27/14636; H01L 27/14685; H01L 27/14687; H01L 31/035236; H01L 31/035218; H01L 31/09
See application file for complete search history.

(56) References Cited

U.S. PATENT DOCUMENTS

| | | | |
|---|---|---|---|
| 6,906,358 B2* | 6/2005 | Grein ..................... | B82Y 20/00 257/103 |
| 8,580,652 B2* | 11/2013 | Kawasaki ......... | H01L 21/76898 257/774 |
| 2011/0068476 A1* | 3/2011 | Kawasaki ......... | H01L 21/76898 257/774 |

* cited by examiner

*Primary Examiner* — Nikolay Yushin
(74) *Attorney, Agent, or Firm* — WPAT, P.C., Intellectual Property Attorneys; Anthony King

(57) ABSTRACT

The present disclosure provides a method of manufacturing an image sensor device. The method includes: forming an etch stop layer on a first substrate; forming a light-sensing region comprising a light sensing quantum structure being able to detect a wavelength greater than about 1.5 um; forming a semiconductive substrate over the light-sensing region, the semiconductive substrate comprising an active component; forming an isolation structure extended through the light-sensing region; selectively removing the first substrate to expose the etch stop layer; and thinning the etch stop layer thereby exposing the light-sensing region.

20 Claims, 17 Drawing Sheets

IMAGE SENSOR DEVICE AND MANUFACTURING METHOD THEREOF

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications.

The image sensor device can be categorized into two types. A front-side illuminated (FSI) type sensor receives incident light from an active surface (front side) of the substrate while a back-side illuminated (BSI) type sensor receives light from a backside of the substrate. The image sensor device is design to transform received light into electrical signals. However, as the component size of image sensors shrinks along with improvements in manufacturing technologies, existing image sensor devices may suffer from performance issues such as electrical or optical crosstalk. As a result, improved image sensor designs are in need.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
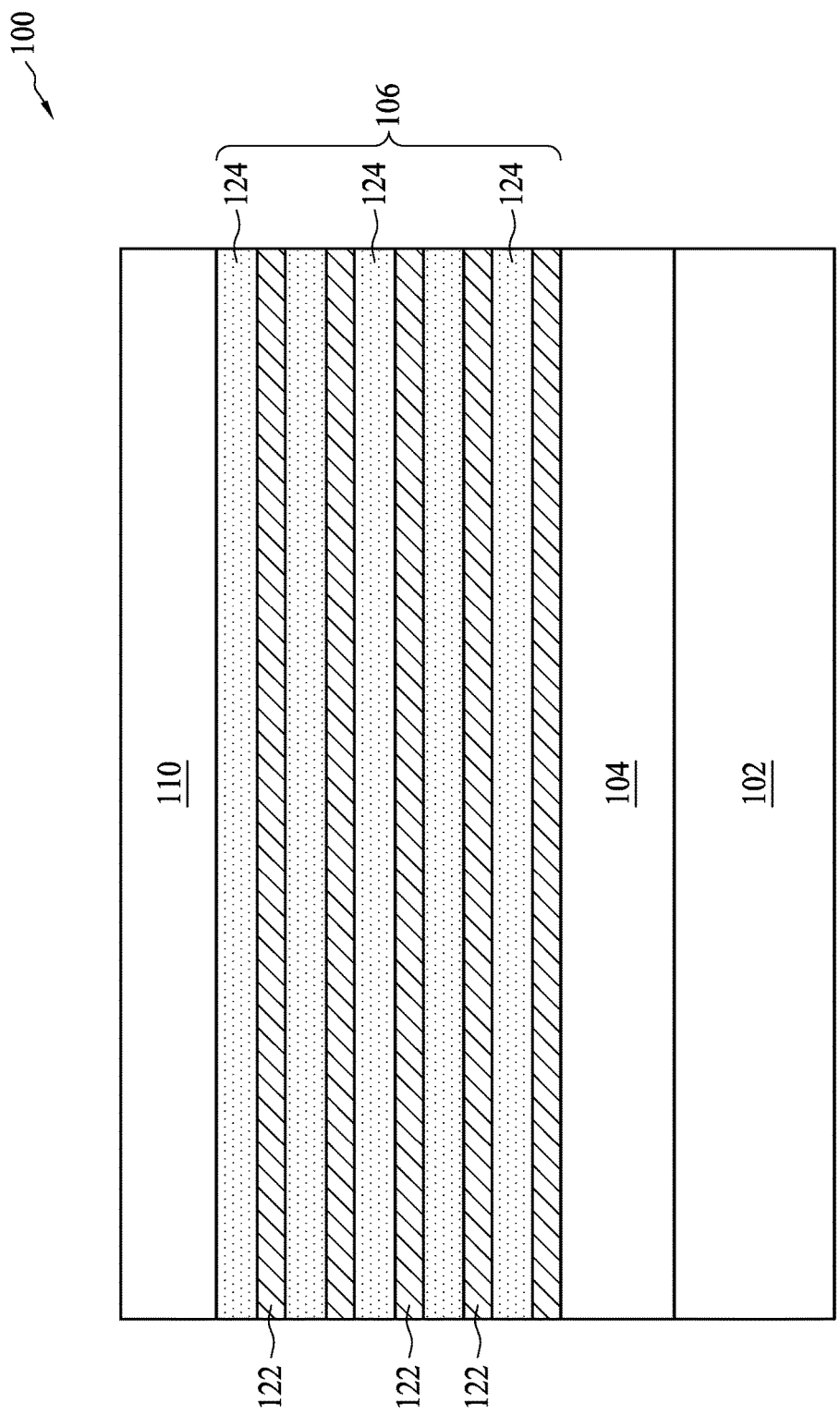
FIGS. 1-10 are cross-sectional views of intermediate stages for manufacturing an image sensor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure presents an image sensor and manufacturing method thereof. A broadband image sensor is proposed to receive a wide range of radiation spectrum, including the visible light, invisible infrared and invisible non-infrared radiations. A deep trench isolation structure is incorporated into the image sensor in order to reduce optical and electrical crosstalk or leakage current between neighboring pixels. The electrical and optical performance of the image sensor is improved accordingly.

FIGS. 1-10 are cross-sectional views of intermediate stages for manufacturing an image sensor device 100 in accordance with various embodiments of the present disclosure.

Referring to FIG. 1, a substrate 102 is initially provided. The substrate 102 may be a carrier substrate. In some embodiments, the substrate 102 may comprise, for example, silicon based materials, such as glass or silicon oxide; aluminum oxide, ceramic materials, or combinations thereof. In one embodiment, the substrate 102 may include other semiconductive materials, such as silicon germanium, silicon carbide, gallium arsenide, or the like. The substrate 102 may be a p-type semiconductive substrate (acceptor type) or n-type semiconductive substrate (donor type). Alternatively, the substrate 102 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI). In other alternatives, the substrate 102 may include a doped epitaxial layer, a gradient semiconductive layer, and/or a semiconductive layer overlying another semiconductive layer of a different type, such as a silicon layer on a silicon germanium layer. The substrate 102 comprises a planar top surface on which semiconductor components or layers can be formed thereon.

In some embodiment, the substrate 102 may comprise an adhesive layer (not separately shown) formed over the substrate 102. The adhesive layer is configured to assist in the adherence between the substrate 102 and the overlying layers. In some embodiments, the adhesive layer may comprise ultra-violet glue whose adhesive strength, when exposed to ultra-violet light, would be degraded. Alternatively, the adhesive layer may comprise other types of adhesives, such as pressure sensitive adhesives, radiation curable adhesives or epoxies.

Subsequently, a layer 104 is formed over the substrate 102. In some embodiments, the layer 104 serves as a sacrificial layer that may be removed in subsequent processing steps. In some embodiments, the layer 104 serves as an etch stop layer in order to prevent an etching process from over etching components or layers underlying the layer 104. In some embodiments, the layer 104 comprises silicon. In some embodiments, the layer 104 comprises a silicon germanium of the form $Si_xGe_{1-x}$, in which the parameter x is from about 10% to about 40%, such as 20%. In some embodiments, the parameter x of the silicon germanium layer is from about 20% to about 40%. In some embodiments, the parameter x of the silicon germanium layer is from about 10% to about 20%.

In some embodiments, the layer 104 is doped by p-type or n-type dopants in order to reduce silicon crystalline damages. In some embodiments, an in-situ doping is used along with the dopants such as boron, phosphorus, carbon, and the like. The precursor gases adopted for the in-situ doping operations are respectively $B_2H_6$, $PH_3$ and $CH_3SiH_3$.

In some embodiments, the layer 104 is formed by epitaxy growth on the substrate 102. A suitable process may be utilized, such as chemical vapor deposition (CVD), low pressure CVD (LPCVD), plasma-enhanced CVD (PECVD), or the like. In some embodiments, the temperature for forming for the layer 104 may be from about 500° C. to about 1000° C.

Subsequent to the formation of the layer 104, a light-sensing region 106 is formed over the layer 104. The light-sensing region 106 receives or detects incident photons, light or radiation incident to the surface of the light-sensing region 106 and transforms the radiation into an electrical signal. The electrical signal may be transmitted to a circuit (not shown), such as a transistor, for subsequent electrical signal processing. In some embodiments, the light-sensing region 106 is formed as a photodiode for detecting radiation. In some embodiments, the light-sensing region 106 is designed to sense visible or invisible light. The visible light may comprise a wavelength with a range from about 0.3 μm to about 0.8 μm. The invisible radiation/light can be infrared light and may comprise a wavelength from about 1.5 μm to about 20 μm. Furthermore, the invisible radiation may be non-visible non-infrared light and comprises a wavelength from about 0.85 μm to about 1.5 μm.

In the present embodiment, the light-sensing region 106 is design to absorb a broad spectrum covering at least one of the visible light, non-visible non-infrared and infrared spectra. For example, the light-sensing region 106 is configured to detect a radiation with wavelength between 0.3 um and 0.8 um. In some embodiments, the light-sensing region 106 is configured to detect a radiation with wavelength between 0.85 um and 1.5 um. In some embodiments, the light-sensing region 106 is configured to detect a radiation with wavelength between 1.5 um and 20 um. In some embodiments, the light-sensing region 106 is configured to detect a radiation with wavelength between 0.3 um and 20 um. In some embodiments, the light-sensing region 106 is configured to detect a radiation with wavelength between 0.85 um and 20 um. In some embodiments, the light-sensing region 106 is configured to detect a radiation with wavelength between 1.5 um and 20 um. In some embodiments, the light-sensing region 106 is configured to detect a radiation with wavelength greater than about 1.5 um. In some embodiments, the light-sensing region 106 can act as a thermoelectric region for transforming thermal data into an electrical signal.

In some embodiments, the light-sensing region 106 comprises a layered structure. Furthermore, the layered structure 106 may include multiple stacked sublayers of silicon layer, silicon germanium layer or the like. In the present embodiment, the light-sensing region 106 is comprised of several layered periods and each period includes a pure silicon layer 122 and a silicon germanium layer 124. The alternating silicon layer 122 and the silicon germanium layer 124 may be formed of a superlattice multiple quantum well structure. Alternatively, the silicon layer 122 and the silicon germanium layer 124 may be formed of a multiple quantum dot matrix. The quantum structures, such as quantum wells and quantum dots, can be formed into image sensing devices to aid in the quantum efficiency. The quantum wells are usually formed in two dimensions. In addition, quantum dots may be lithographically defined by etching on two-dimensional electron gases in semiconductor heterostructures.

In some embodiments, the silicon germanium layer 124 comprises the combination $Si_xGe_{1-x}$, in which the parameter x is from about 10% to about 90%, such as 30%. In some embodiments, the parameter x of the silicon germanium layer 124 is from about 30% to about 40%, such as 35%. In some embodiments, the parameter x of the silicon germanium layer is from about 10% to about 30%, such as 20%. In some embodiments, a germanium concentration of the silico germanium layer 124 is greater than a germanium concentration of the layer 104.

In some embodiments, the alternating layers composed of the silicon layers 122 and the silicon germanium layers 124 are formed by epitaxy growth. In some embodiments, a suitable process may be utilized, such as chemical vapor deposition (CVD), low pressure CVD (LPCVD), plasma-enhanced CVD (PECVD), metal organic CVD (MOCVD), evaporation, sputtering, molecular mean epitaxy (MBE), atomic layer deposition (ALD) or the like. In some embodiments, the temperature of the formation for the silicon layer 122 or the silicon germanium layer 124 may be from about 500° C. to about 1000° C. In some embodiments, a planarization process, such as grinding or chemical mechanical planarization (CMP) operation may be utilized to level the top surfaces of the grown epitaxial layers in order to remove excess material of the layers. In some embodiments, the silicon layer 122 and the silicon germanium layer 124 extends along a direction substantially parallel to the surface of the layer 104.

The silicon layer 122 comprises a first thickness measured from a direction perpendicular to a top surface thereof. The silicon germanium layer 124 comprises a second thickness measured from a direction perpendicular to a top surface thereof. The first thickness and the second thickness may be referred to a well width of a quantum structure which is correlated to the inter-subband transition wavelength. For example, the first thickness is determined as less than 20 nm, such as 16 nm, for detecting visible light. Additionally, the second thickness is determined as less than 10 nm, such as 4 nm, in order to detect non-visible non-infrared and infrared radiations. In some embodiments, the first thickness is from about 10 nm to about 15 nm. In some embodiments, the second thickness is from about 2 nm to about 5 nm. In some embodiments, each of the periods comprises a third thickness from about 12 nm to about 20 nm. In some embodiments, the light-sensing region 106 comprises a thickness of about 2 μm which comprises about 100 repeated periods and each period includes a multiple quantum structure material of silicon/silicon-germanium layers. The multiple quantum structure may be designed to absorb radiation with wavelength substantially equal to or greater than 1.5 μm.

Still referring to FIG. 1, a substrate layer 110 is formed over the light-sensing region 106. The substrate layer 110 may comprise pure silicon or silicon based materials, such as silicon oxide; aluminum oxide, ceramic materials, or combinations thereof. In one embodiment, the substrate layer 110 may include other semiconductive materials, such as silicon germanium, silicon carbide, gallium arsenide, or the like. The substrate layer 110 may be a p-type semiconductive substrate (acceptor type) or n-type semiconductive substrate (donor type). Alternatively, the substrate layer 110 includes another elementary semiconductive material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the die substrate 102 is a semiconductor-on-insulator (SOI). In other alternatives, the substrate 110 may include a doped epitaxial layer, a gradient semiconductive layer, and/or a semiconductive layer overlying another semiconductive layer of a different type, such as a silicon layer on a silicon germanium layer. The substrate 110 comprises a planar top surface on which semiconductor components or layers can be formed thereon.

In some embodiments, the substrate layer 110 is formed by epitaxy growth. In some embodiments, the substrate layer 110 is formed by a chemical vapor deposition (CVD), low pressure CVD (LPCVD), plasma-enhanced CVD (PECVD), or the like. In some embodiments, a planarization process, such as grinding or chemical mechanical planarization (CMP) operation may be utilized to level the top surface of the substrate layer 110 in order to remove excess material of the layers.

Figure 2:
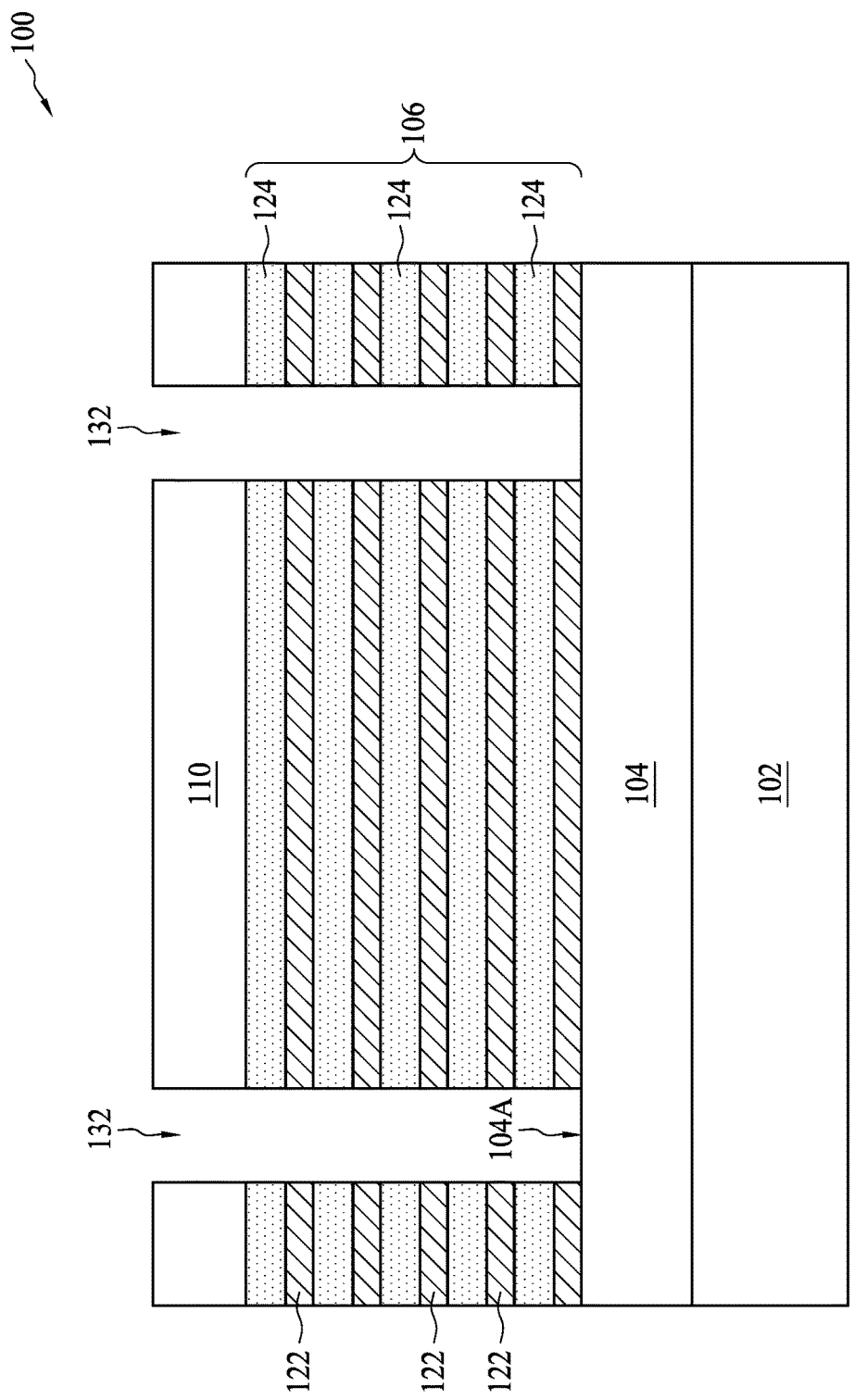

FIG. 2 shows a cross-sectional view of intermediate stage for manufacturing the image sensor device 100 in accordance with various embodiments of the present disclosure. Several trenches 132 are formed above the layer 104. In some embodiments, the trenches 132 extend through the substrate layer 110. In some embodiments, the trench 132 exposes a portion of a top surface 104A of the layer 104. In some embodiments, the trench 132 comprises a width of uniform width. In some embodiments, the trench 132 comprises a declined sidewall. In some embodiments, the trenches 132 are initially formed by recessing through the substrate 110 and then through the light-sensing region 106. In some embodiments, a depth of the layer 104 is also recessed.

Figure 3A:
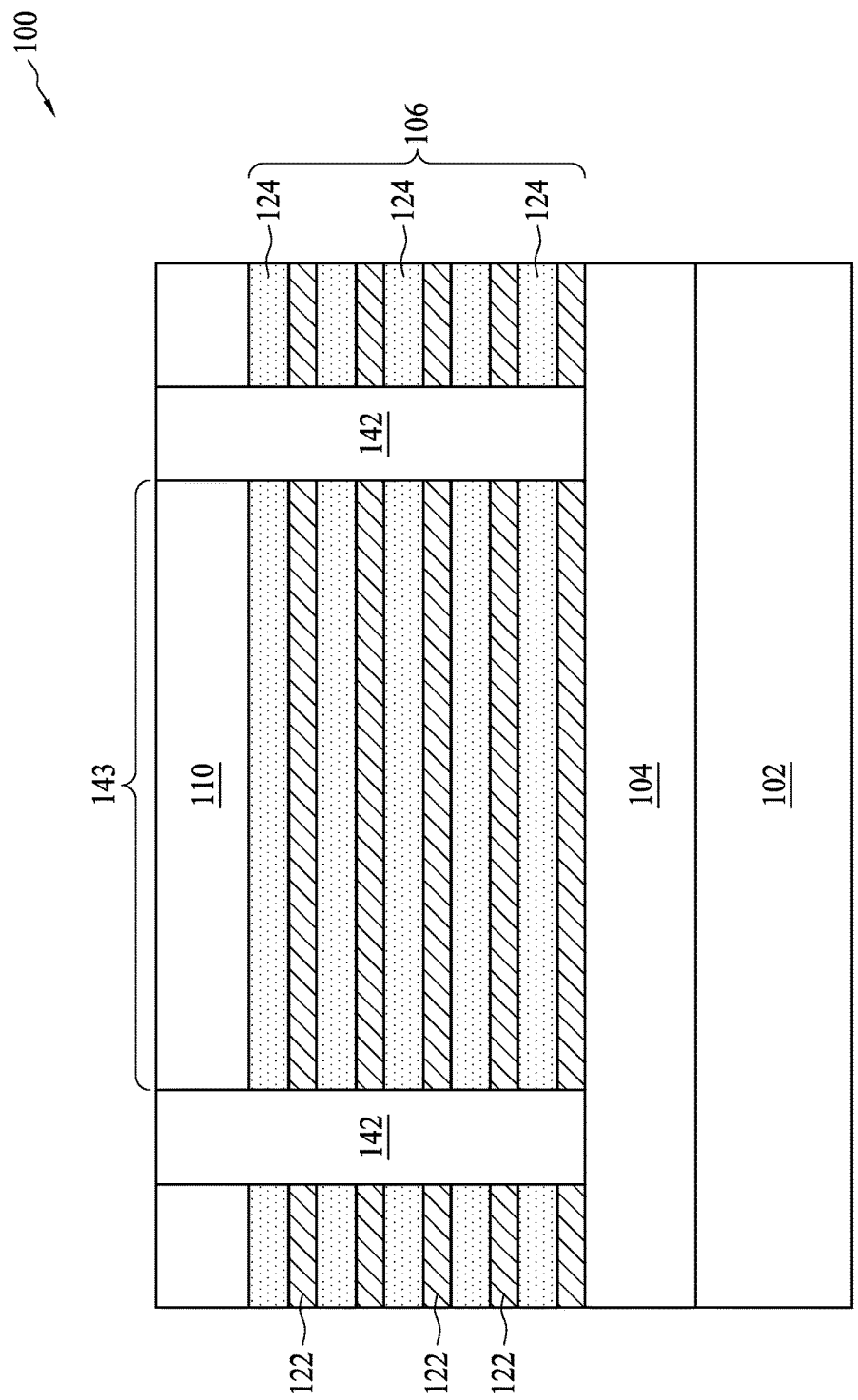

Next, as shown in FIG. 3A, the trenches 132 are filled and isolation structures 142 are formed in the trenches accordingly. In some embodiments, the isolation structure 142 is a deep trench isolation structure which penetrates through the substrate layer 110. In some embodiments, the isolation structure 142 extends through the light-sensing region 106. In some embodiments, the isolation structure 142 physically contacts the top surface 104A of the layer 104. In some embodiments where the layer 104 and the substrate 102 may be removed, the isolation structure 142 is exposed from the light-sensing region 106. In some embodiments, a planarization operation, such as grinding or chemical mechanical planarization processes may be used to remove excess materials of the isolation structure 142 and level the top surface of the isolation structure 142 with the substrate layer 110.

The isolation structures 142 may be formed of electrically insulating materials, such as dielectric materials. In some embodiments, a high-k dielectric layer 142 comprises metal oxides. In some embodiments, the isolation structures 142 are formed of an oxide (e.g., Ge oxide), a nitride (e.g., silicon nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, and the like. The dielectric material 142 may be formed using a suitable process such as atomic layer deposition (ALD), chemical vapor deposition (CVD), physical vapor deposition (PVD), thermal oxidation, UV-ozone oxidation, or combinations thereof.

Figure 3B:
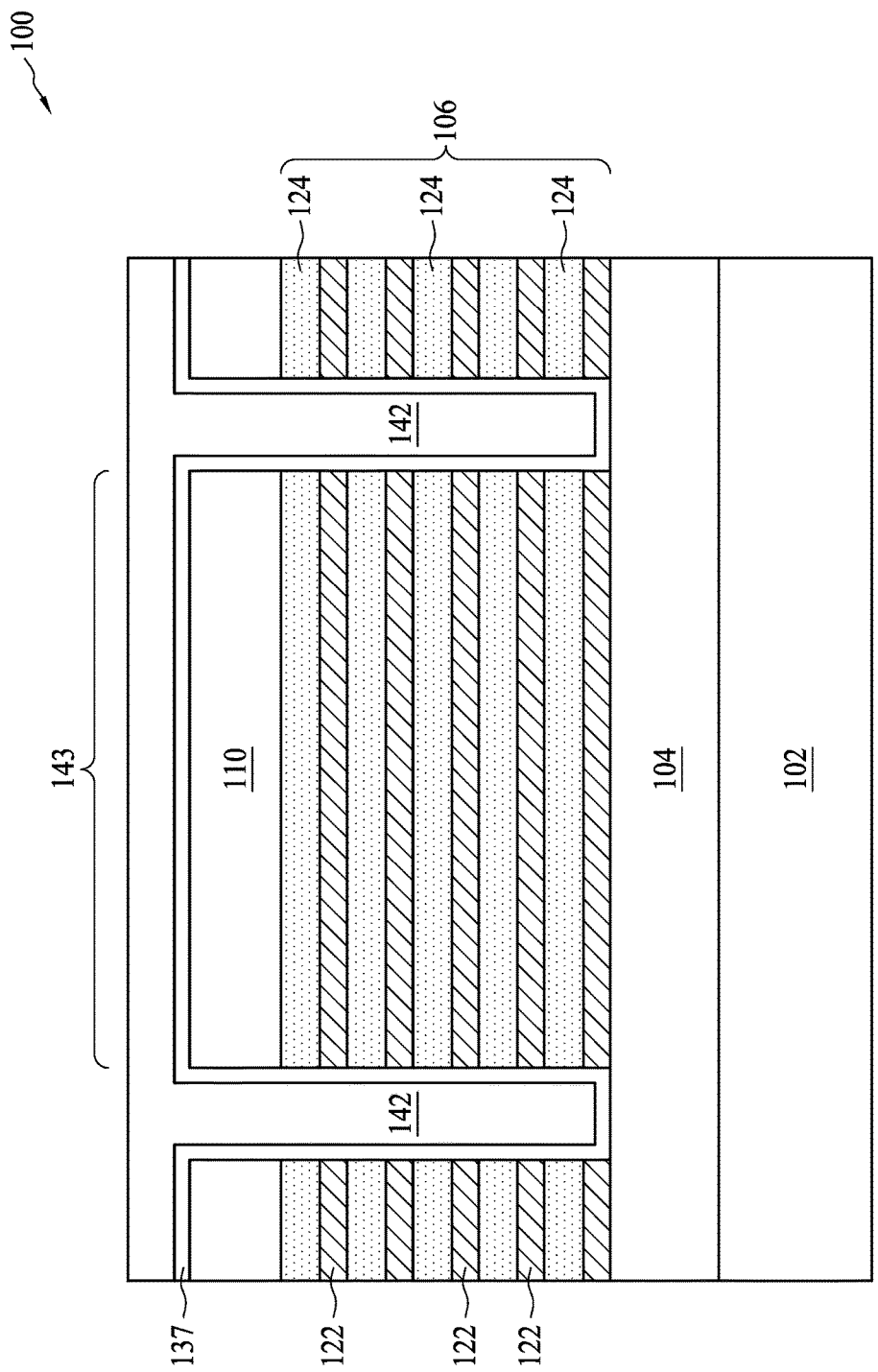

In alternative embodiments, the isolation structure 142 may comprise a multi-layer structure. Referring to FIG. 3B, a layer 137 is lined to the sidewalls and bottom of the trench 132. In some embodiments, the layer 137 also covers a top surface of the substrate layer 110. The material of the layer 137 may be dielectric materials such as $Al_2O_3$, $HfO_2$, $ZrO_2$, $Ta_2O_5$, or $TiO_2$ and is used as a negative charge layer which can aid in preventing electrons from being trapped near the isolation region due to its high concentration of negative charges. Then, a second dielectric layer 142 is formed over the layer 137 in which the remaining vacancies of the trenches 132 are filled. The dielectric layer 142 may comprise insulating materials such as polysilicon or dielectric materials. In some embodiments, the layer 137 and the layer 142 may comprise similar materials.

Figure 3C:
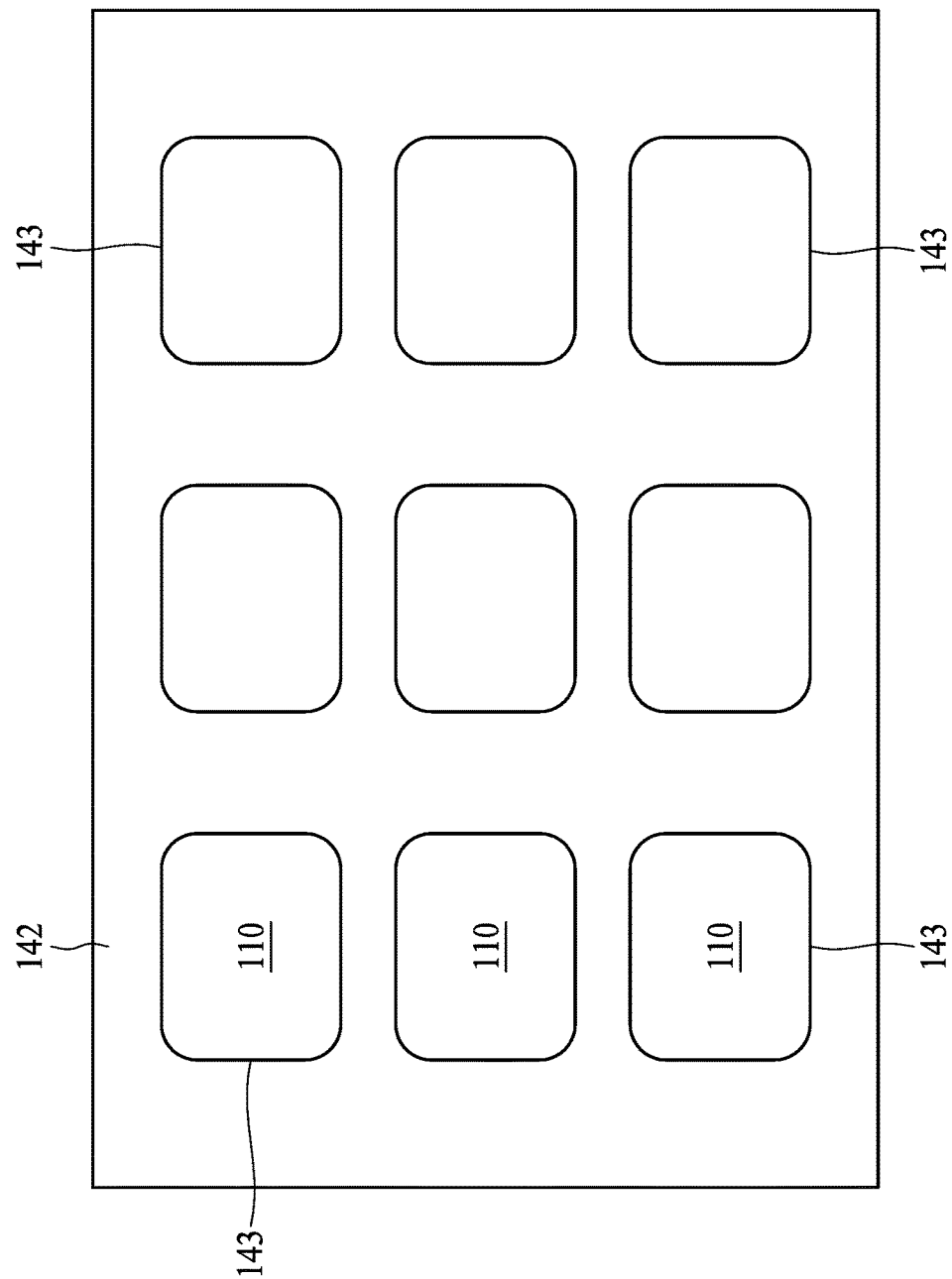

In some embodiments, the isolation structures 142 help in forming an image sensing-array. Referring to FIG. 3C, a grid of isolation structure 142 is formed in order to divide the light-sensing region 106 into an array of individual image-sensing pixels 143. The isolation structure 142 also defines the boundaries of the image-sensing pixels 143. Each of the pixels 143 corresponds to a sensing unit for constructing the object image. In some embodiments, the isolation structures 142 surround each of the pixels 143 laterally. The image sensor device 100 comprises several pixels 143 from a top view. Accordingly, each light-sensing region 106 (covered by the substrate layer 110 and is thus not shown in FIG. 3C) is separated from one another by the isolation structure 142.

Referring to FIG. 3A and FIG. 3C, the pixels 143 are arranged in rows and columns with one exemplary pixel illustrated in FIG. 3A. The dielectric materials of the isolation structure 142 constitute contiguous sidewalls interfacing the pixels 143. In addition, the sidewalls of the isolation structures 142 at the sides of the pixel 143 form the boundary of the pixels 143. Since the neighboring pixels 143 are separated from each other by the isolation structure 142, light incident upon each pixel 143 may only propagate within the original pixel since the travelling route of photon or light is confined by the isolation structures 142. The isolation structures 142 may reflect or absorb the optical signal or electrical signal such that the phenomenon of cross talk or leakage current between light-sensing pixels 143 can be effectively reduced or mitigated.

Figure 4:
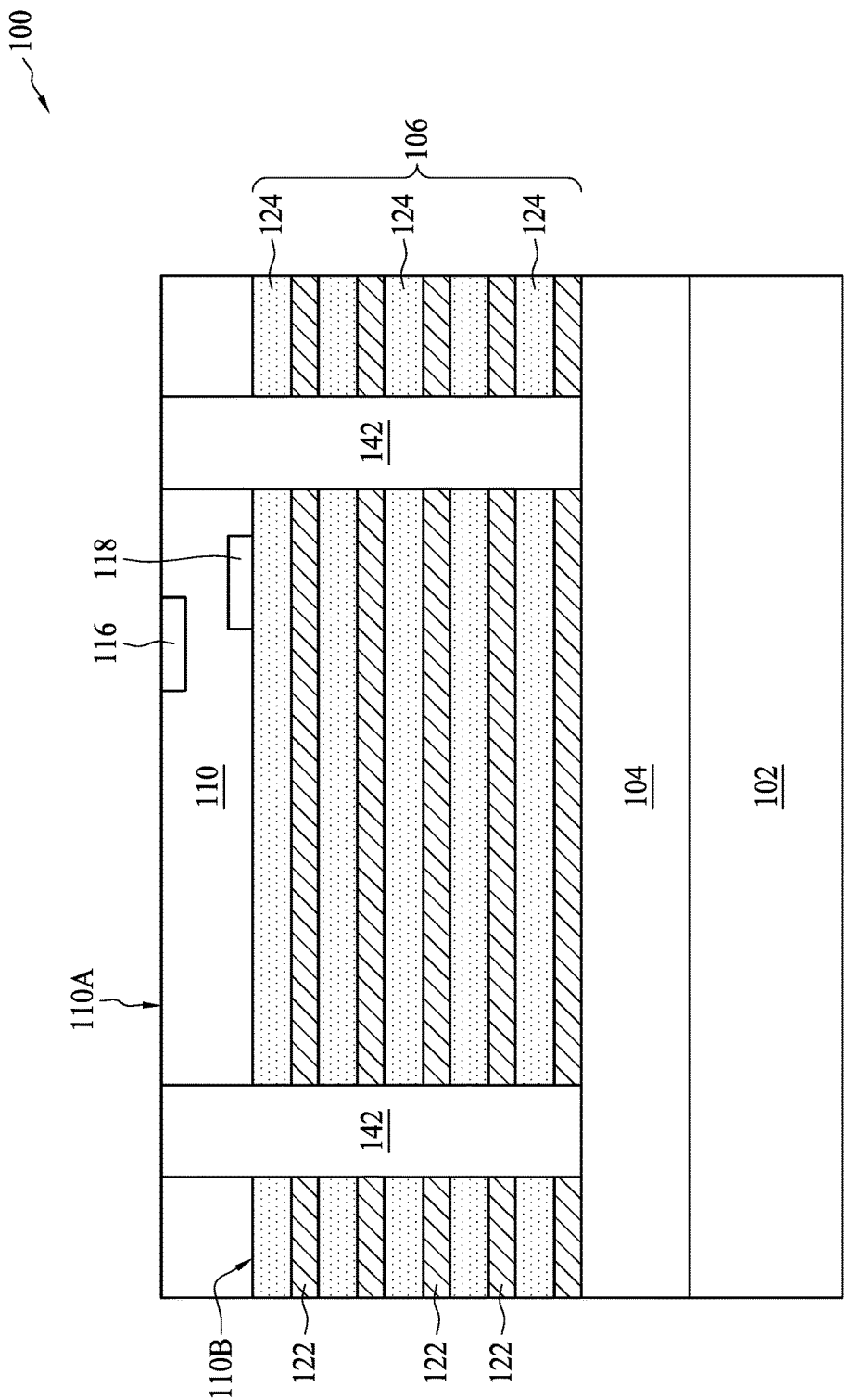

FIG. 4 shows a cross-sectional view of intermediate stage for manufacturing the image sensor device 100 in accordance with various embodiments of the present disclosure. In some embodiments, at least one electrical component 116 is formed on an active surface 110A of the substrate layer 110. The electrical component 116 may include a passive component, for example, a resistor, a capacitor, an inductor, a diode, or the like. In some embodiments, the electrical component 116 may be an active component, such as a transistor, formed on the active surface 110A. Other features, such as contacts, wiring or junctions, may also be manufactured in the substrate layer 110. The active surface 110A is also referred to a front side of the substrate layer 110 throughout the present disclosure. The electrical components 116 may be spaced apart from the isolation structure 142. In some embodiments, the electrical components 116 are formed subsequent to the formation of the isolation structure 142. In alternative embodiments, the isolation structure 142 is formed subsequent to the formation of the electrical component 116.

In some embodiments, the substrate layer 110 may include a circuit or conductor 118 on a back side 110B opposite to the front side 110A. The conductor 118 electrically couples electrical signals induced from the light-sensing region 106 to the substrate layer 110. The image sensor type in which the incident radiation or light impinges upon the back side 110B of the substrate layer 110 through the light-sensing region 106 is referred to as the back-side illumination (BSI) sensor.

Figure 5:
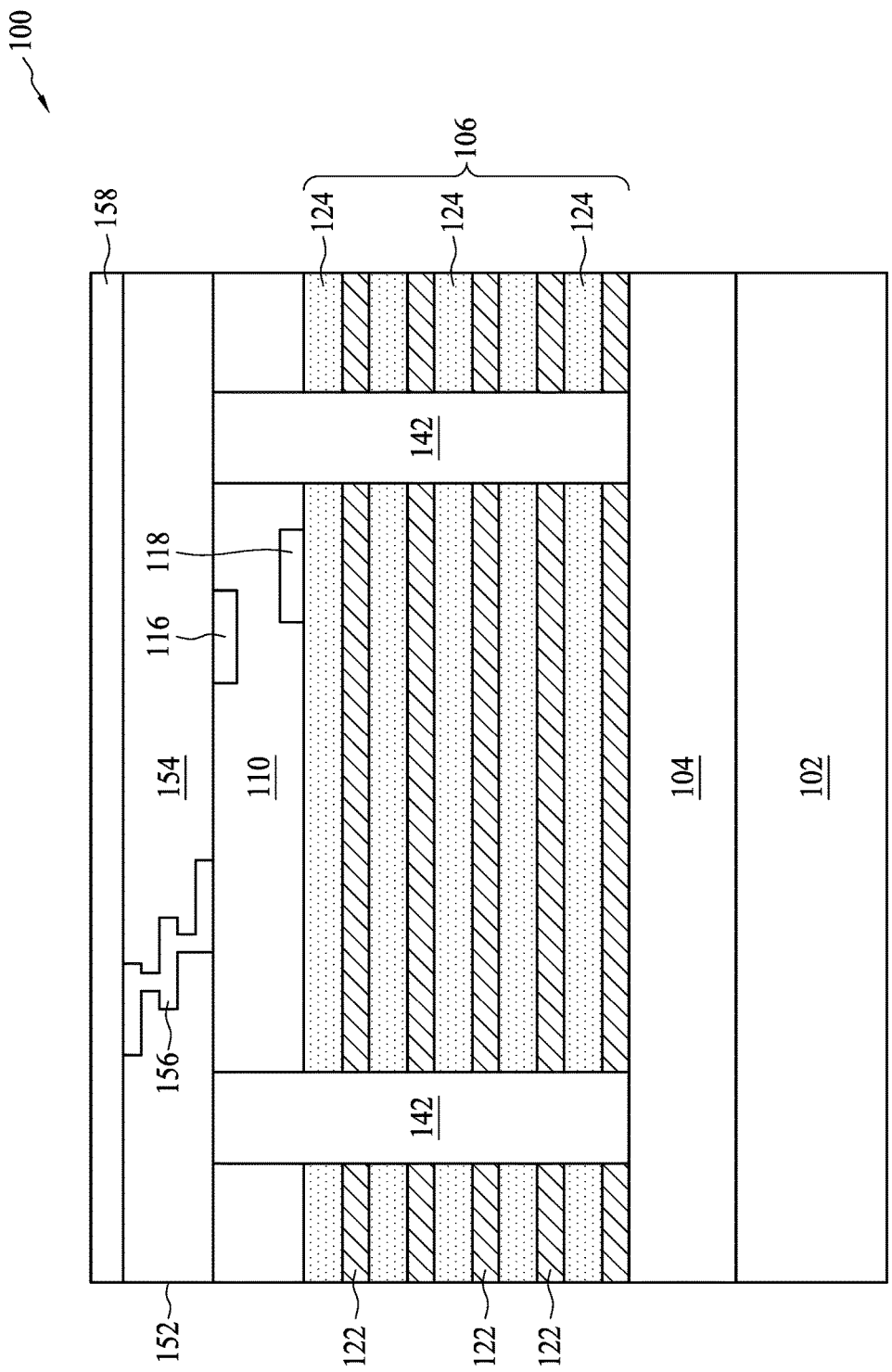

Referring to FIG. 5, an interconnect layer 152 is formed over the substrate layer 110. The interconnect layer 152 is configured to electrically couple the components of the substrate layer 110. The interconnect layer 152 may include multiple conductive features 156 such as metal layers and metal vias. The conductive features 156 are interconnected in order to construct electrical connections. In some embodiments, the conductive features 156 are formed of conductive materials, such as copper, silver, gold, tungsten, combinations or alloy thereof.

Moreover, the conductive features 156 are insulated by a dielectric material 154. In some embodiments, the dielectric material 154 cover the isolation structure 142 and the substrate layer 110. The dielectric material 154 may be formed of oxides, such as un-doped Silicate Glass (USG), Fluorinated Silicate Glass (FSG), low-k dielectric materials, or the like.

In some embodiments, a passivation layer 158 is formed over the interconnect layer 152 and the substrate layer 110. The passivation layer 158 provides protection of the image sensor device 100 from contamination or external stress. The passivation layer 158 may be formed of dielectric materials, such as oxide, undoped silicate glass (USG), silicon nitride (SiN), silicon dioxide ($SiO_2$) or silicon oxynitride (SiON).

Figure 6:
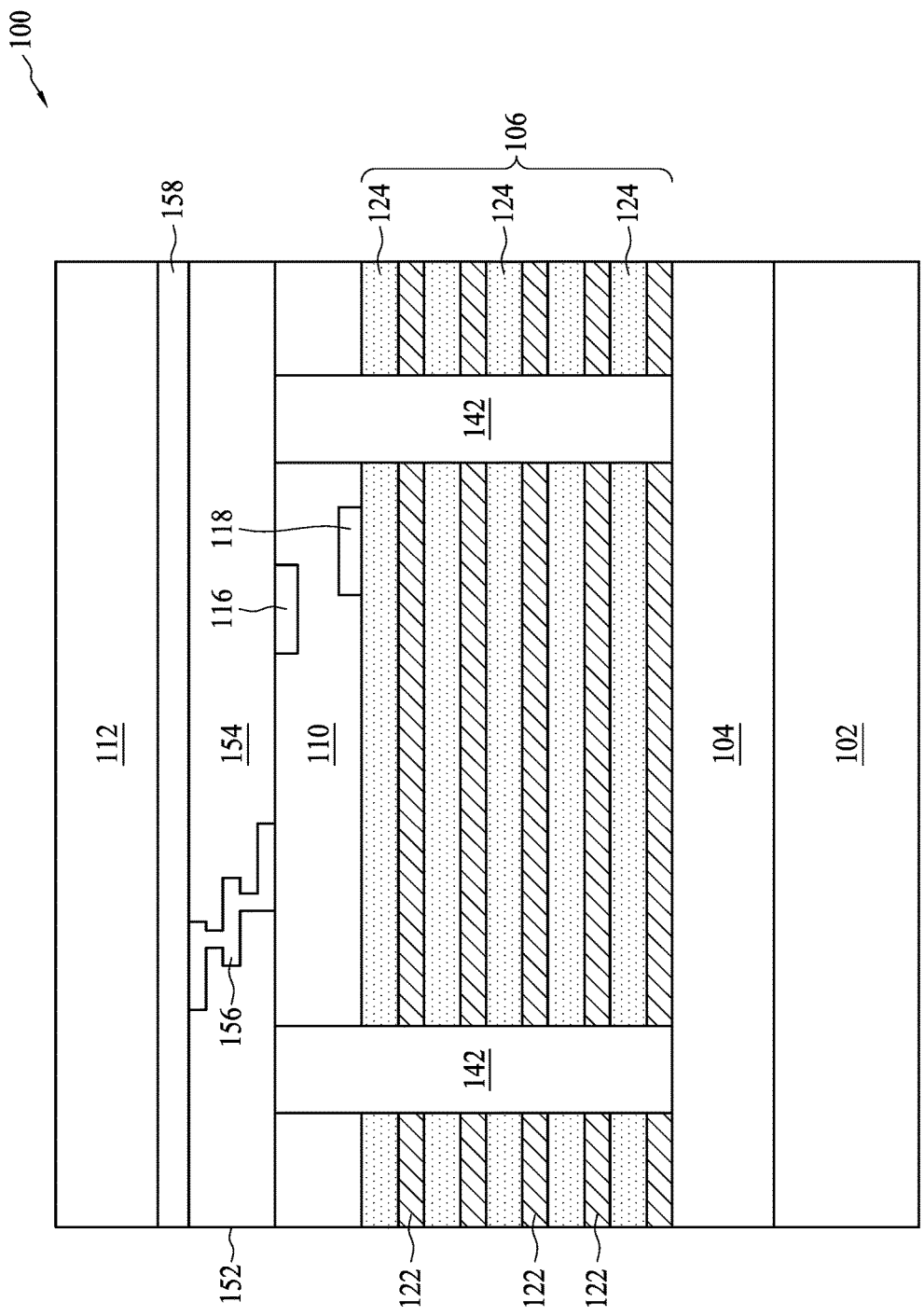

Referring to FIG. 6, a carrier 112 is bonded to the image sensor device 100 through the passivation layer 158. The carrier 112 may comprise a silicon based material, such as glass or silicon oxide; aluminum oxide, ceramic materials, or combinations thereof. The bonding operations may involve any suitable process, such as plasma-enhanced wafer bonding. In some embodiment, an additional adhesive layer (not separately shown) may be formed between the passivation layer 158 and the carrier 112. The adhesive layer is configured to assist in the adherence between the passivation layer 158 and the carrier 112. In some embodiments, the adhesive layer may comprise ultra-violet glue whose adhesive strength, when exposed to ultra-violet light, would be degraded.

Figure 7:
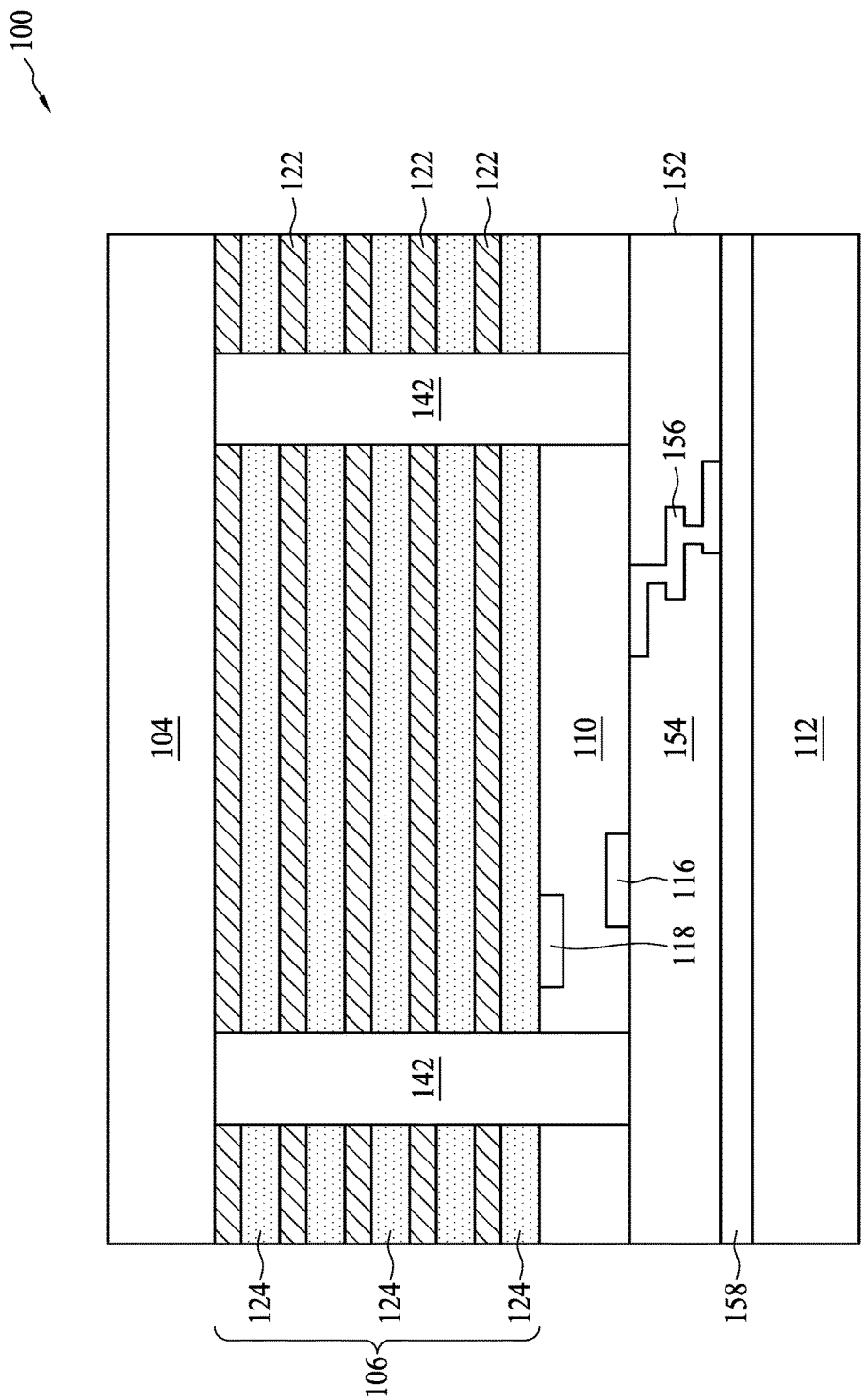

Then, as illustrated in FIG. 7, the image sensor device 100 is flipped. The substrate 102 is thinned or removed from the layer 104. As a result, at least a portion of the layer 104 may be exposed. The substrate 102 may be selectively removed by a suitable process, such as a wet etching operation or a dry etch operation. The dry etch operation may include a reactive ion etch (RIE) operation. In the embodiment in which the wet etching operation is adopted, the substrate 102 is thinned and the etch is stopped at the layer 104. In some embodiments, the substrate layer 102 and the light-sensing region 106 may comprise similar materials. As a result, the layer 104 serving as an etch stop layer may prevent the removal of the substrate 102 from over etching the light-sensing region 106. In some embodiments, an etchant of the wet etch operation for removing the substrate 102 may comprise $CF_4$, HBr, $CF_2CL_2$, $NH_4OH$, $H_2O_2$, $H_2SO_4$, combination or the like. In some embodiments, the substrate 102 and the etch stop layer 104 are differentiated by an etching selectivity measured by a ratio of etch rates, e.g., between 3 and 10, with respect to a specific etchant.

Figure 8:
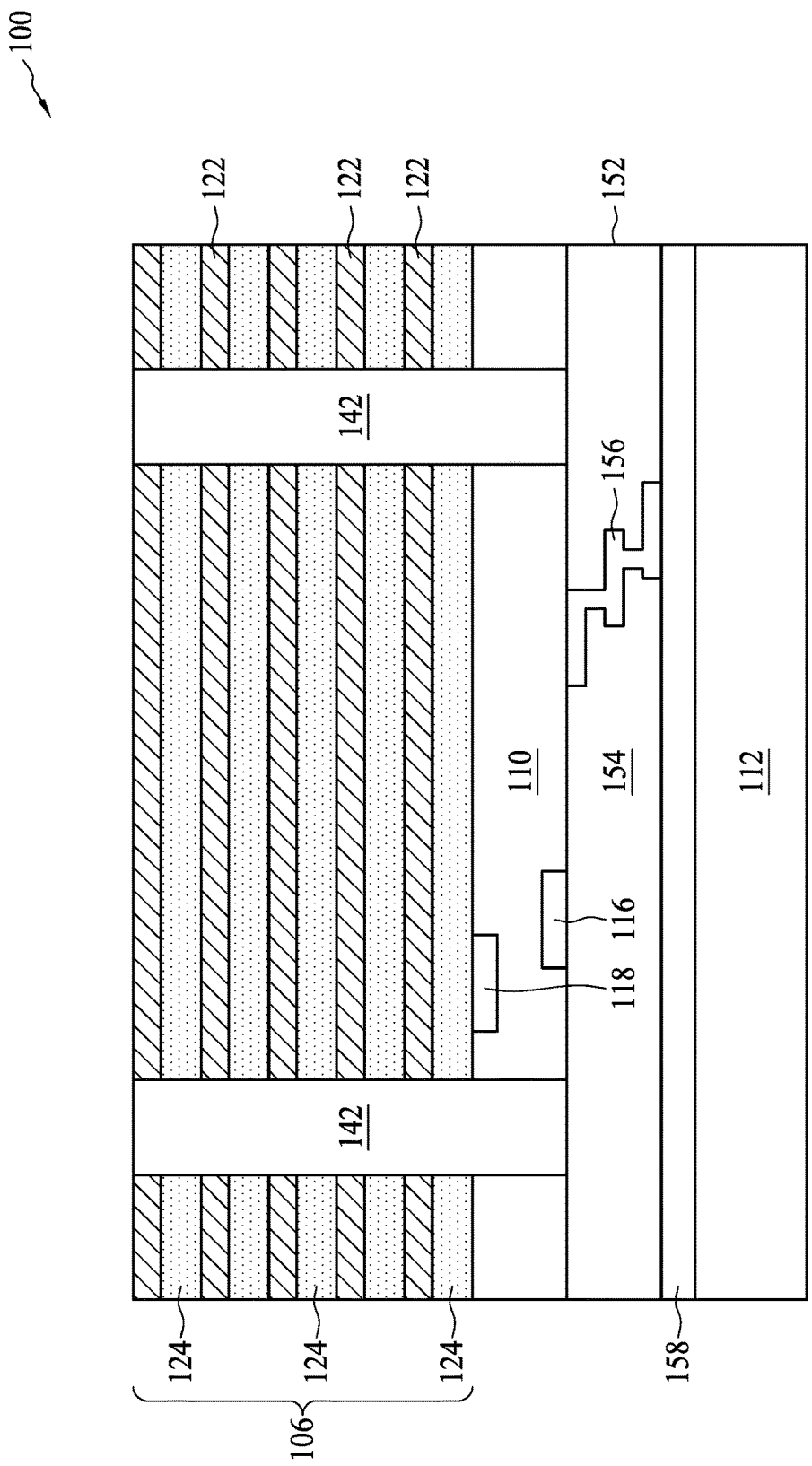

Subsequent to the etching of the substrate 102, the etch stop layer 104 is also selectively thinned or removed, as shown in FIG. 8. As a result, a portion of the light-sensing region 106 or the image-sensing pixels 134 is exposed. The removal may be performed by a dry etch operation or a wet etch operation using an etchant such as $CF_4$, HBr, $CF_2CL_2$, $NH_4OH$, $H_2O_2$, $H_2SO_4$, combination or the like. In some embodiments, the light-sensing region 106 and the etch stop layer 104 are differentiated by an etching selectivity measured by a ratio of etch rates, e.g., between 3 and 10, with respect to a specific etchant. As a result, the etching of the etch stop layer 104 would not impact the integrity of the image-sensing region 106 due to the etch selectivity between the etch stop layer 104 and the image-sensing region 106. In some embodiments, the etchant used for the substrate 102 is different from the etchant used for the etch stop layer 104.

Figure 9:
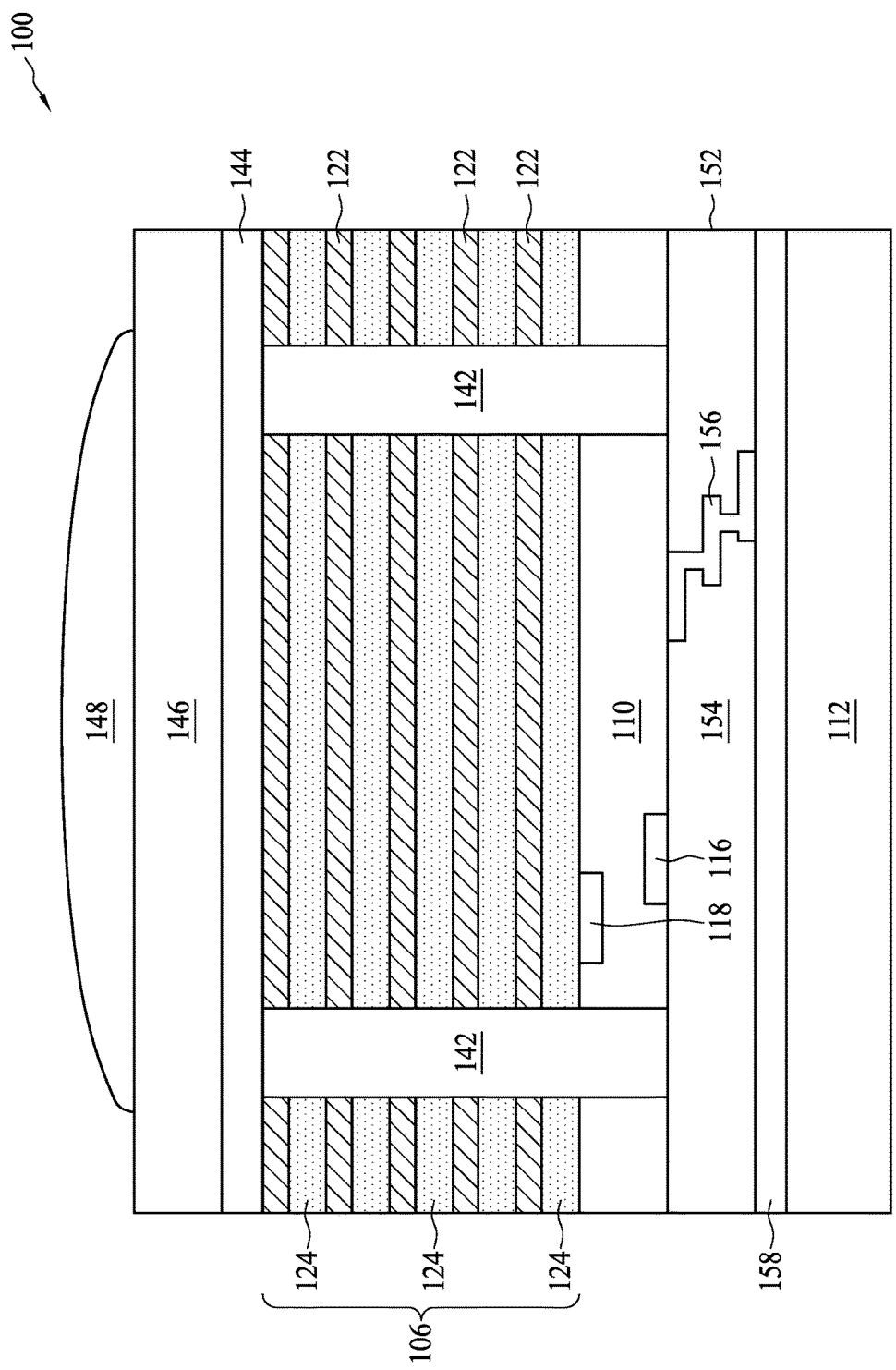

Referring to FIG. 9, a color filter layer 146 may be formed over the light-sensing region 106. In some embodiments, the color filter layer 146 comprises different color filter elements corresponding to the pixels 143. The color filter element is designed to allow a predetermined range of light wavelength to pass while absorbing or reflecting other wavelengths. Accordingly, a filtered color of the light, e.g., red, green, and blue filter, may be received by the light-sensing region 106 under a scenario of visible-light imaging. In some embodiments, other type of color filter element passing different color, such as cyan, yellow, and magenta, may also be used.

The color filter layer 146 may be formed of polymer or resin materials. In some embodiments, the color filter layer 146 may comprise a pigmented or dyed material, such as an acrylic. In some embodiments, polymethyl-methacrylate (PMMA) or polyglycidylmethacrylate (PGMS) may be utilized with which a pigment or dye may be added to form the color filter layer 46. Other materials, however, may be used.

In some embodiments, the image sensor device 100 further comprises a layer 144 between the color filter layer 146 and the light-sensing region 106. In some embodiments, the layer 144 covers the light-sensing region 106 and the isolation structure 142. In some embodiments, the layer 144 may be a doped layer, such as a P-type dopant, in order to aid in converting the photons to the charges. The doped layer 144 may be formed of an ion-implantation operation and optionally followed by a laser annealing process.

In some embodiments, the layer 144 is a passivation layer. In some embodiments, the layer 144 comprises a dielectric material. The passivation layer 144 may be formed of a variety of dielectric materials such as silicon oxide, silicon nitride (SiN), silicon oxynitride, silicon oxycarbide (SiOC), silicon carbide, fluorinated silicon oxide (SiOF), carbon-doped silicon oxide (e.g., SiOCH), spin-on glass (SOG), amorphous fluorinated carbon, fluorinated silica glass (FSG), polyimide, BCB (bis-benzocyclobutenes), non-porous materials, porous materials, and/or combinations thereof. In some embodiments, the dielectric layer 144 includes a high density plasma (HDP) dielectric material (e.g., HDP oxide) and/or a high aspect ratio process (HARP) dielectric material (e.g., HARP oxide).

In some embodiments, a microlens layer 148 is formed over the color filter layer 146. The microlens layer 48 may be formed of any suitable material, such as a high transmittance, acrylic polymer. In some embodiments, the microlens layer 148 is formed using a material in a liquid state and spin-on techniques and patterned into a predetermined shape. In some embodiments, other methods, such as deposition techniques like CVD, physical vapor deposition (PVD), or the like, may also be used.

Figure 10:
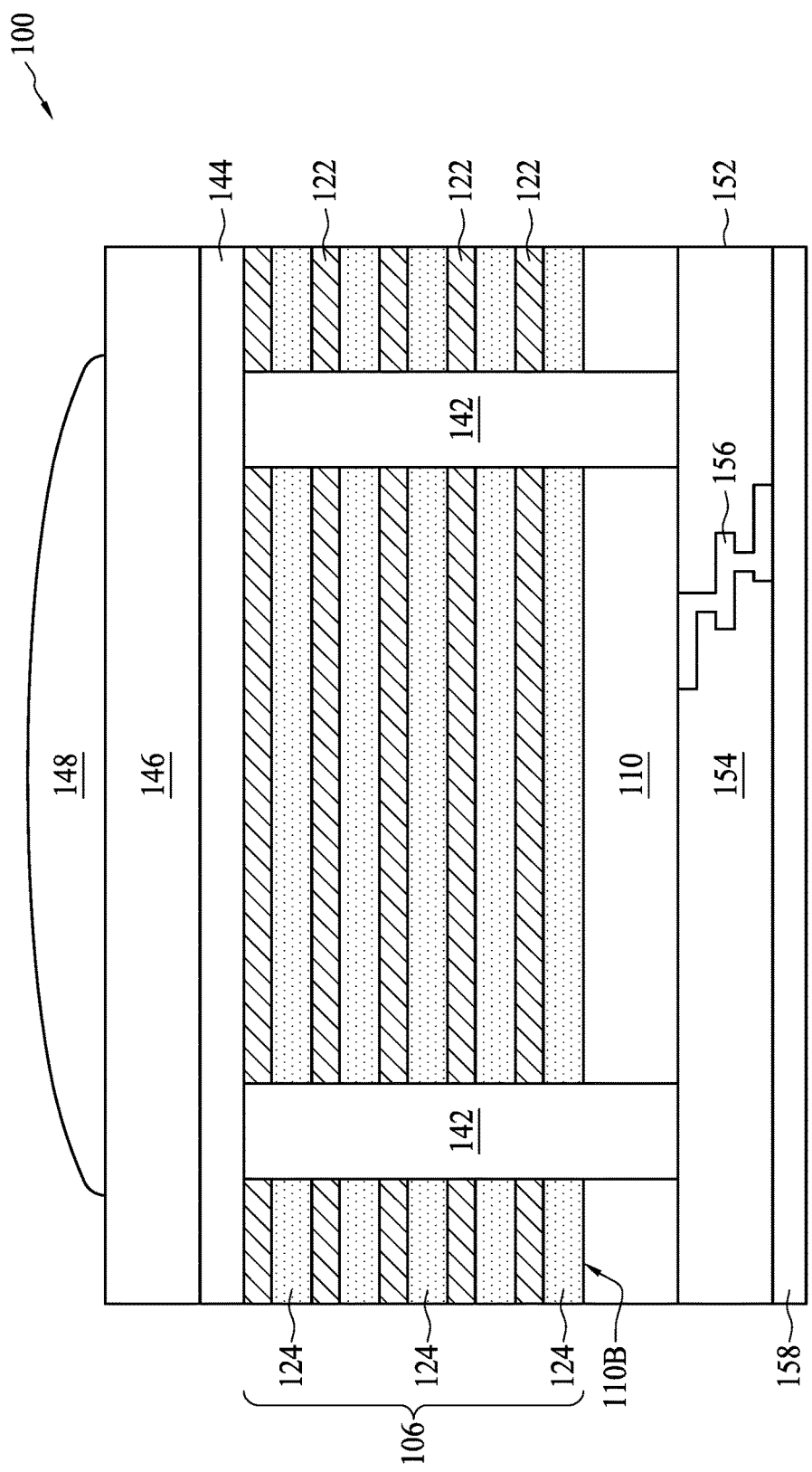

Referring to FIG. 10, after the microlens layer 148 is completed, the carrier 112 is removed from the image sensor device 100. As discussed previously, the image sensor device 100 is constructed as a back-side illumination (BSI) image sensor where light is incident from a back side 110B of the substrate layer 100 through the microlens layer 148.

Figure 11:
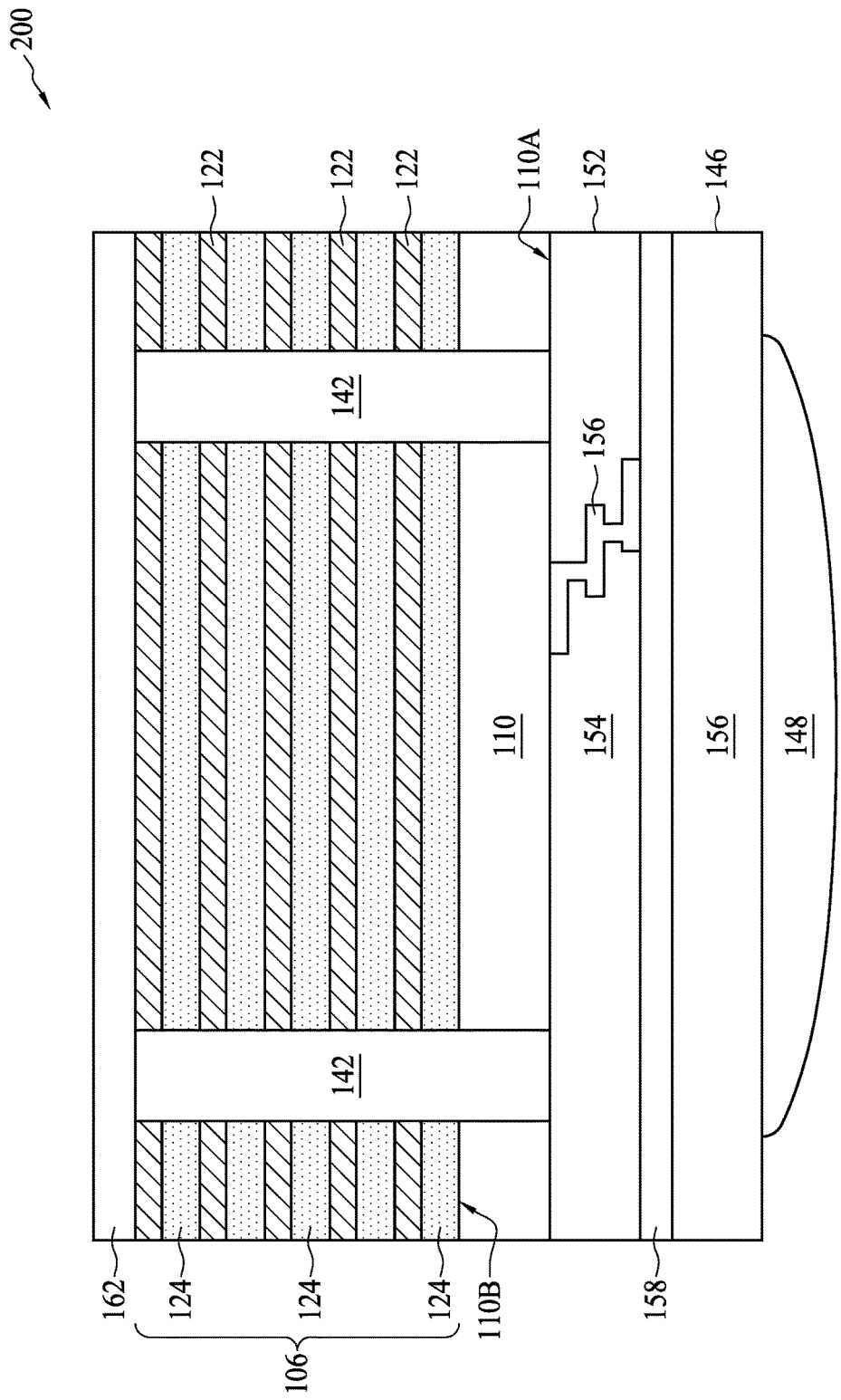
FIG. 11 is a cross-sectional view of an image sensor device in accordance with various embodiments of the present disclosure.

FIG. 11 is a cross-sectional view of an image sensor device 200 in accordance with various embodiments of the present disclosure. By comparison to the BSI sensor device 100 in FIG. 10, the image sensor device 200 is formed in a front-side illumination (FSI) configuration where the light is received through the front side 110A, opposite to the back side 110B, of the substrate layer 110. In an embodiment, the light-sensing region 106 is formed over the back side 110B of the substrate layer 110. The isolation structure 142 extends through the light-sensing region 106 and exposed from a top surface of the light-sensing region 106. The color filter 146 and the microlens 148 are disposed on the passivation layer 158. In some embodiments, a passivation layer or dielectric layer 162 is formed over the light-sensing region 106 and covers the isolation structure 142.

As discussed previously, the trenches 132 used for the isolation structure 142 are formed by etching the substrate layer 110 and the light-sensing region 106 sequentially. The trenches 132 penetrates from the front side 110A to the back side 110B of the substrate layer 110, and further through the light-sensing region 106 until the bottom of the light-sensing region 106. In other embodiments, the isolation structures 142 may be formed in different approaches. For example, trenches 132 may be formed by initially recessing the back side 110B of the substrate layer 110, as would be discussed later.

Figure 12:
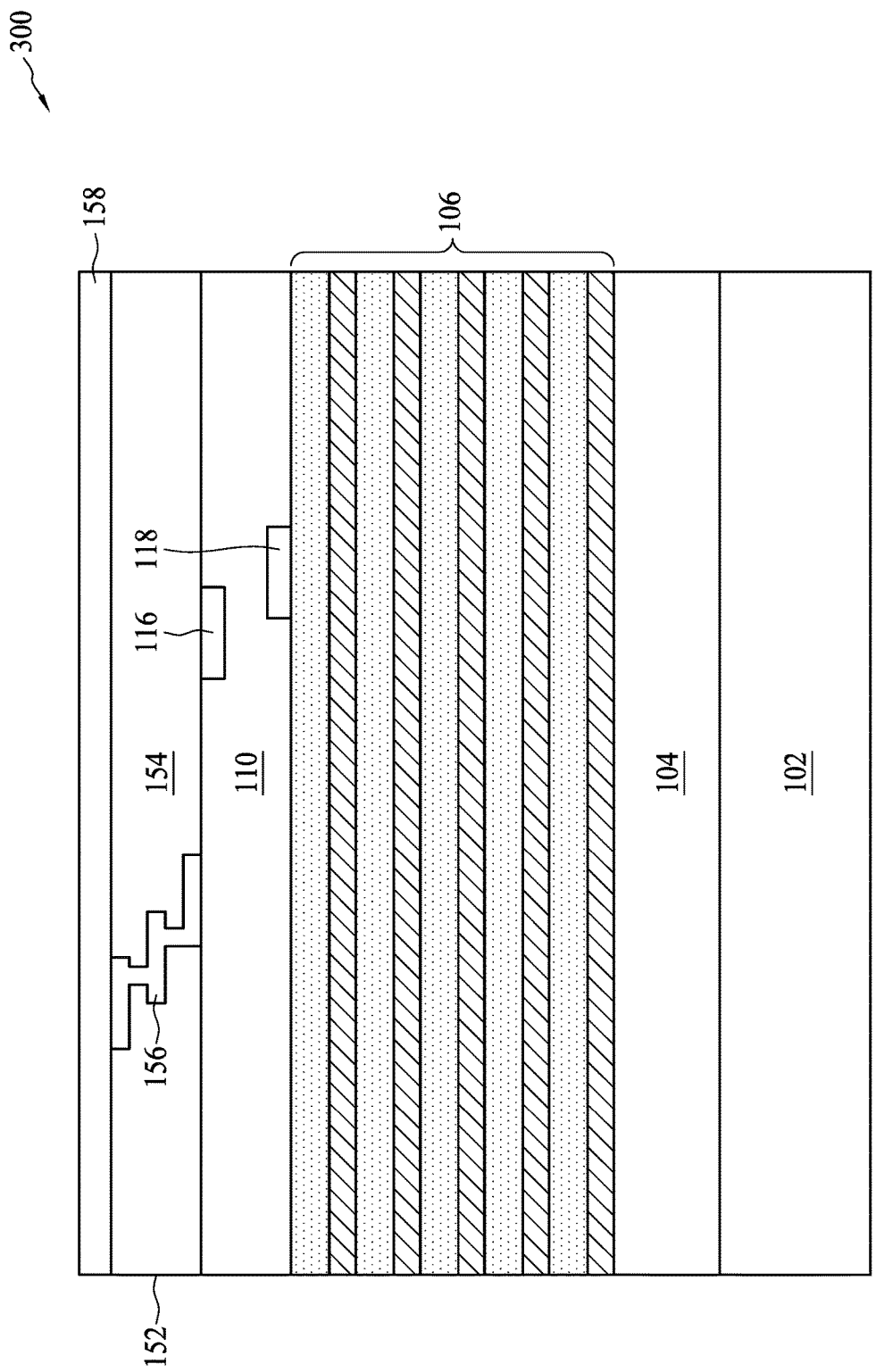
FIGS. 12-15 are cross-sectional views of intermediate stages for manufacturing an image sensor device in accordance with various embodiments of the present disclosure.

FIGS. 12-15 are cross-sectional views of intermediate stages for manufacturing an image sensor device 300 in accordance with various embodiments of the present disclosure. Referring to FIG. 12, the substrate 102, the etch stop layer 104 and the light-sensing region 106 are epitaxially deposited over one another in a sequence of processing steps. Then, the substrate layer 110 and the interconnect layer 152 (optionally including the passivation layer 158) are formed over the light-sensing region 106. The materials and processes for the above-mentioned layers are implemented similarly to those discussed, for example in FIGS. 1-10, and would not be repeated for the sake of simplicity.

Figure 13:
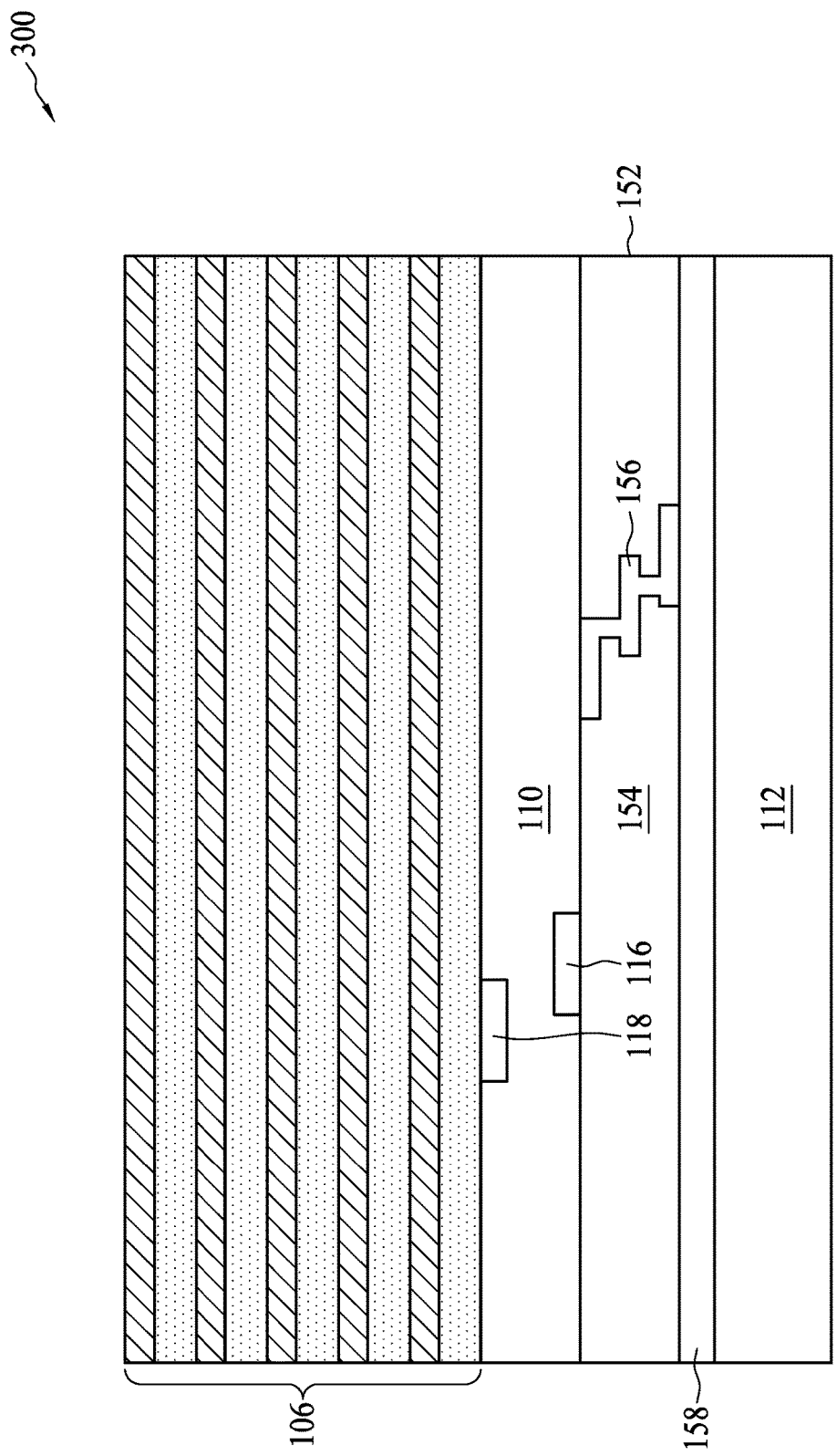

Subsequently, the carrier 112 is bonded to the substrate layer 110. The sensor device 300 is then flipped as illustrated in FIG. 13. The substrate 102 and the etch stop layer 104 are thinned or removed using operations similar to those illustrated in FIG. 7 and FIG. 8.

Figure 14:
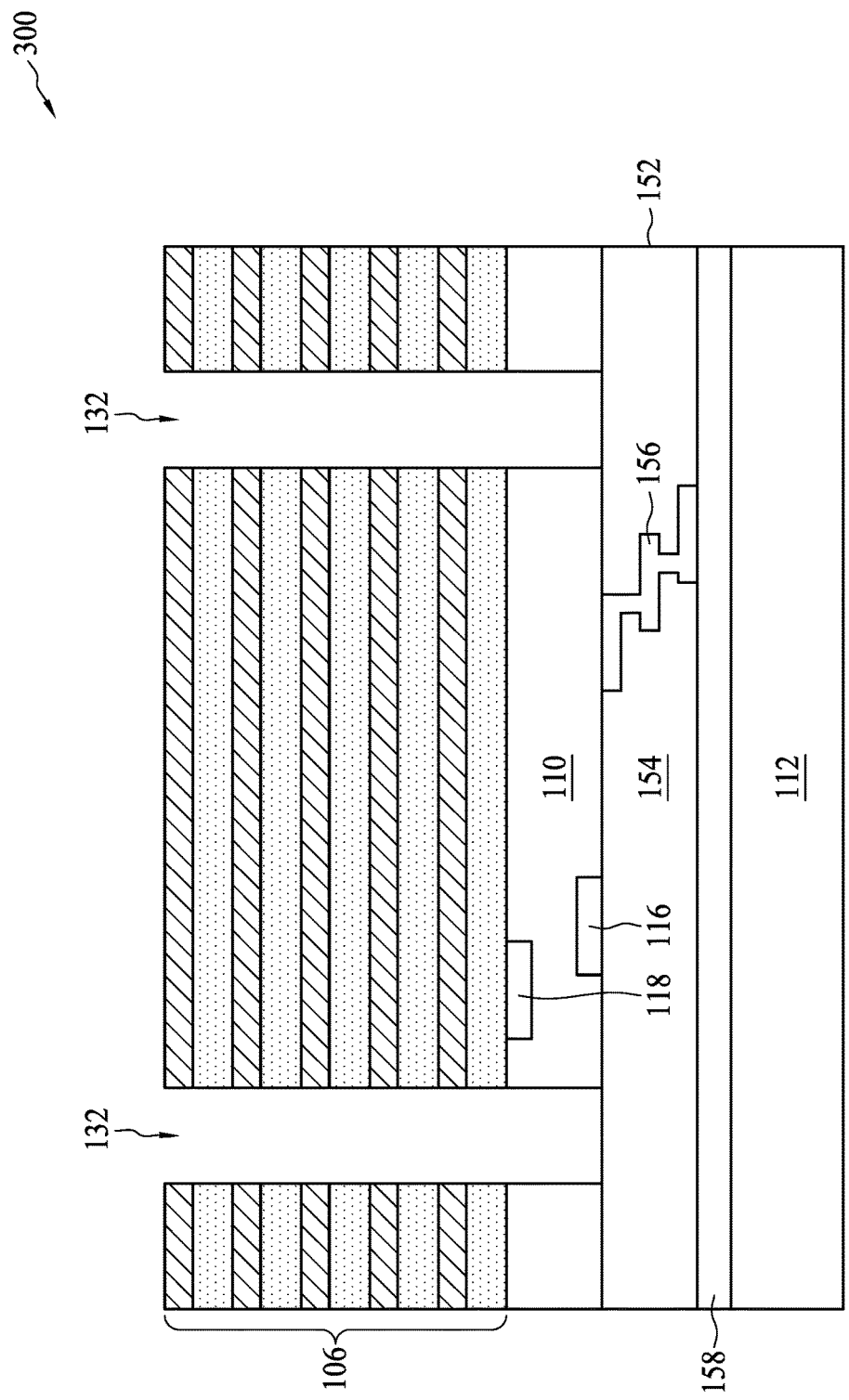

Referring to FIG. 14, after the substrate 102 and the etch stop layer 104 are thinned, the trenches 132 are formed by recessing through the light-sensing region 106 and the substrate layer 110. The recessing operation is performed initially from the light-sensing region 106 and then through the substrate layer 110. In some embodiments, the operation steps of FIG. 13 and FIG. 14 may be interchanged, i.e., the trenches 132 are formed prior to the thinning of after the substrate 102 and the etch stop layer 104. In that case, the trenches 132 is formed by recessing the layer 102, the layer 104, the image-sensing region 106 and the substrate layer 110 sequentially.

In some embodiments, a depth of the interconnect layer 152 is also etched. In some embodiments, the trenches 132 may extend through the interconnect layer 152 and reach the passivation layer 158. The trenches 132 are disposed away from electrical components in the substrate layer 110 or the interconnect layer 152 such that the electrical and optical performances of the image sensor device 300 would not be impacted.

Figure 15:
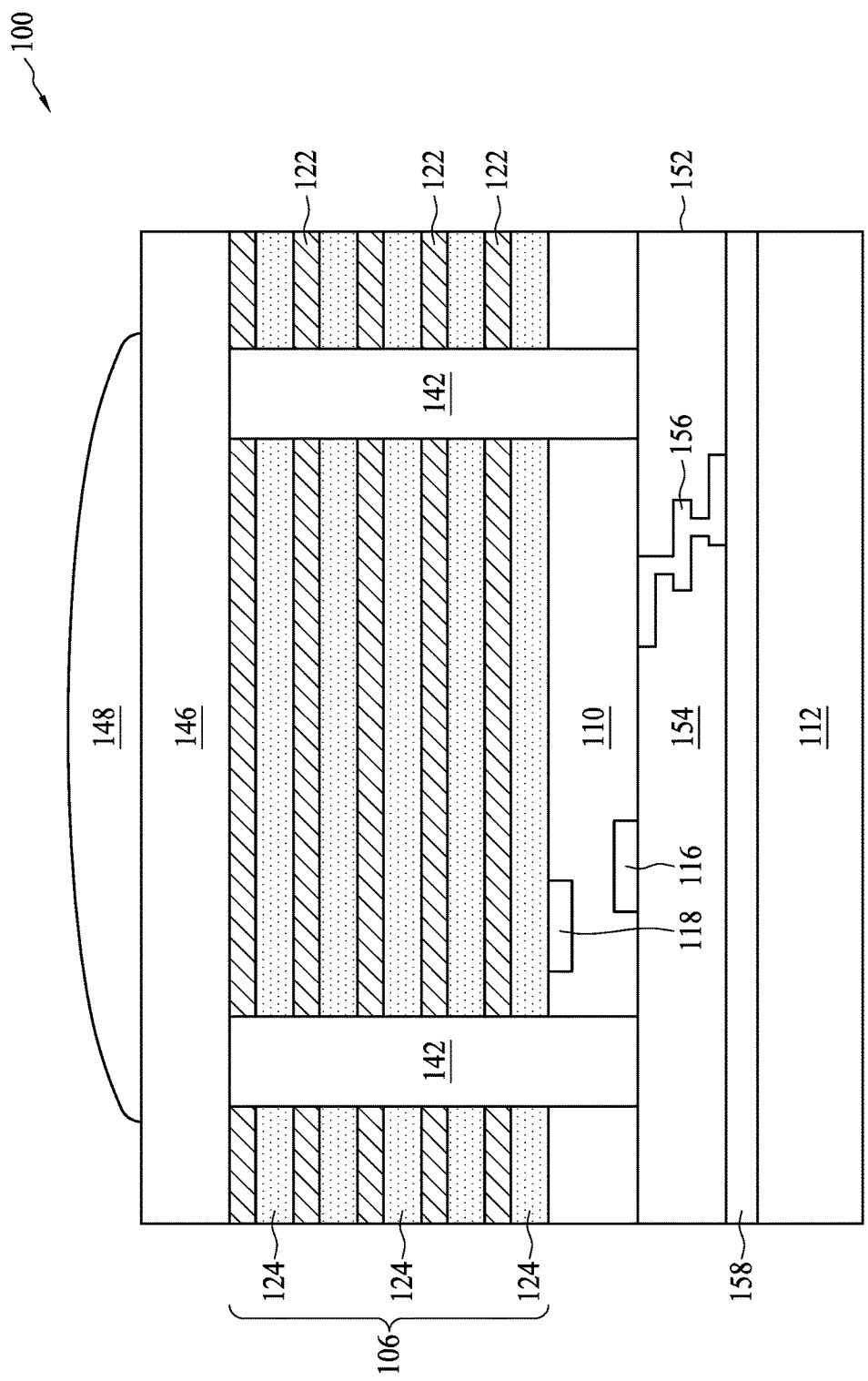

FIG. 15 illustrates the filling of suitable insulating materials into the trenches 132. The isolation structure 142 is formed accordingly. The color filter 146 and the microlens 148 may also be disposed over the light-sensing region 106. Although the image sensor device 300 is implemented as a BSI sensor type, the manufacturing process and materials applied for an FSI type image sensor are also with the contemplated scope of the present disclosure.

The present disclosure provides a method of manufacturing an image sensor device. The method includes: forming an etch stop layer on a first substrate; forming a light-sensing region comprising a light sensing quantum structure being able to detect a wavelength greater than about 1.5 um; forming a semiconductive substrate over the light-sensing region, the semiconductive substrate comprising an active component; forming an isolation structure extended through the light-sensing region; selectively removing the first substrate to expose the etch stop layer; and thinning the etch stop layer thereby exposing the light-sensing region.

The present disclosure provides a method of manufacturing an image sensor device. The method includes: forming an etch stop layer on a first substrate; forming a light-sensing region over the etch stop layer, the light-sensing region comprising a light sensing quantum structure being able to absorb radiation; forming a second substrate over the light-sensing region; dividing the light-sensing region into an array of image-sensing pixels via an isolation grid; forming an active component on a front side of the second substrate; and thinning the first substrate.

The present disclosure provides an image sensor device which includes a substrate and a light-sensing region over the substrate. The light-sensing region includes over the etch stop layer, the light-sensing region comprising a light sensing quantum structure being able to absorb radiation. The image sensor device also includes an interconnect layer on a side of the substrate opposite to the light-sensing region. The image sensor device further includes an isolation structure extending through the light-sensing region and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
 a substrate;
 a light-sensing region over the substrate, the light-sensing region comprising a light sensing quantum structure being able to absorb radiation;
 an interconnect layer on a side of the substrate opposite to the light-sensing region; and
 an isolation structure extending through the light-sensing quantum structure and the substrate.

2. The image sensor device of claim 1, wherein the isolation structure contacts the interconnect layer.

3. The image sensor device of claim 1, wherein the isolation structure comprises:
 a first material lining a sidewall of the isolation structure; and
 a second material over the first material and a top surface of the light-sensing region.

4. The image sensor device of claim 1, further comprising a passivation layer on a side of the light-sensing region opposite to the substrate, wherein the isolation structure physically contacts the passivation layer.

5. The image sensor device of claim 1, wherein the light sensing quantum structure is formed of a plurality of layered periods, and a thickness of one of the layered periods is from about 12 nm to about 20 nm.

6. A method of manufacturing an image sensor device, the method comprising:
   forming an etch stop layer on a first substrate;
   forming a light-sensing region comprising a light-sensing quantum structure being able to detect a wavelength greater than about 1.5 um;
   forming a semiconductive substrate over the light-sensing region, the semiconductive substrate comprising an active component;
   forming an isolation structure extended through the light-sensing region;
   selectively removing the first substrate to expose the etch stop layer; and
   thinning the etch stop layer thereby exposing the light-sensing region.

7. The method of claim 6, wherein the isolation structure comprises a material selected from a group consisting of oxide, nitride and polysilicon.

8. The method of claim 6, wherein the active component is formed on a front side of the semiconductive substrate subsequent to the formation of the isolation structure.

9. The method of claim 6, wherein forming the etch stop layer comprises epitaxially growing a silicon germanium layer and performing in-situ doping.

10. The method of claim 9, wherein the silicon germanium layer of the etch stop layer comprises a concentration of germanium of about 20%.

11. The method of claim 6, further comprising:
   forming a trench extended through the semiconductive substrate and the light-sensing region; and
   filling the trench with an electrical insulating material to form the isolation structure.

12. The method of claim 11, wherein forming a trench extended through the semiconductive substrate and the light-sensing region comprises initially recessing the semiconductive substrate and then through the light-sensing region.

13. The method of claim 11, wherein forming a trench extended through the semiconductive substrate and the light-sensing region exposes a portion of the etch stop layer.

14. The method of claim 6, wherein the light-sensing quantum structure comprises alternating silicon layers and silicon germanium layers, and each of the silicon germanium layers comprises germanium with a concentration from about 30% to about 40%.

15. The method of claim 14, wherein each of the silicon germanium layers comprises a thickness from about 2 nm to about 5 nm.

16. The method of claim 14, wherein each of the silicon layers of the light-sensing quantum structure comprises a thickness from about 10 nm to about 15 nm.

17. A method of manufacturing an image sensor device, the method comprising:
   forming an etch stop layer on a first substrate;
   forming a light-sensing region over the etch stop layer, the light-sensing region comprising a light sensing quantum structure being able to absorb radiation;
   forming a second substrate over the light-sensing region;
   dividing the light-sensing region into an array of image-sensing pixels via an isolation grid;
   forming an active component on a front side of the second substrate; and
   thinning the first substrate.

18. The method of claim 17, further comprising forming a color filter layer over the light-sensing pixels.

19. The method of claim 17, wherein dividing the light-sensing region into an array of image-sensing pixels via an isolation grid comprises forming a trench by recessing from the light-sensing region towards the second substrate.

20. The method of claim 19, wherein forming a trench by recessing from the light-sensing region towards the second substrate is performed after the first substrate is thinned.

* * * * *